United States Patent
Kim et al.

(10) Patent No.: US 8,765,028 B2
(45) Date of Patent: Jul. 1, 2014

(54) COMPOSITION FOR OXIDE THIN FILM, METHOD OF PREPARING THE COMPOSITION, METHOD OF FORMING THE OXIDE THIN FILM, AND ELECTRONIC DEVICE USING THE COMPOSITION

(75) Inventors: Hyun Jae Kim, Seoul (KR); You Seung Rim, Seoul (KR); Dong Lim Kim, Seoul (KR)

(73) Assignee: Industry-Academic Cooperation Foundation, Yonsei University, Seoul (KR)

( * ) Notice: Subject to any disclaimer, the term of this patent is extended or adjusted under 35 U.S.C. 154(b) by 426 days.

(21) Appl. No.: 13/114,353

(22) Filed: May 24, 2011

(65) Prior Publication Data
US 2012/0049181 A1   Mar. 1, 2012

(30) Foreign Application Priority Data
Aug. 26, 2010   (KR) .......................... 10-2010-0083136

(51) Int. Cl.
*H01L 29/12* (2006.01)
*H01B 1/08* (2006.01)
*H01B 1/02* (2006.01)

(52) U.S. Cl.
USPC ............... 252/519.51; 252/520.1; 252/520.2; 252/520.21; 252/520.5; 252/519.1; 257/43; 257/E29.068

(58) Field of Classification Search
USPC ........................................ 252/519.51, 519.3
See application file for complete search history.

(56) References Cited

U.S. PATENT DOCUMENTS

| 3,984,591 | A * | 10/1976 | Plumat et al. ................. 427/165 |
| 7,242,039 | B2 | 7/2007 | Hoffman et al. |
| 7,420,215 | B2 | 9/2008 | Inoue et al. |
| 2007/0184576 | A1 | 8/2007 | Chang et al. |

FOREIGN PATENT DOCUMENTS

KR   10-1025701 B1   3/2010

OTHER PUBLICATIONS

U.S. Appl. No. 13/341,060 to Kim et al.*
U.S. Appl. No. 13/322,193 to Kim et al.*

* cited by examiner

*Primary Examiner* — Harold Pyon
*Assistant Examiner* — Katie L Hammer
(74) *Attorney, Agent, or Firm* — Carter, DeLuca, Farrell & Schmidt, LLP

(57) ABSTRACT

Provided are a composition for an oxide semiconductor, a method of preparing the composition, methods of forming an oxide semiconductor thin film and an electronic device using the composition. The composition for an oxide semiconductor includes a tin compound, a zinc compound, and a low electronegativity metal compound containing a metal with an electronegativity lower than zinc.

31 Claims, 5 Drawing Sheets

COMPOSITION FOR OXIDE THIN FILM, METHOD OF PREPARING THE COMPOSITION, METHOD OF FORMING THE OXIDE THIN FILM, AND ELECTRONIC DEVICE USING THE COMPOSITION

CROSS-REFERENCE TO RELATED APPLICATIONS

This U.S. non-provisional patent application claims priority under 35 U.S.C. §119 of Korean Patent Applications No. 10-2010-0083136, filed on Aug. 26, 2010, the entire contents of which are hereby incorporated by reference.

BACKGROUND

The exemplary embodiments of the inventive concept relate to a composition for an oxide thin film, a method of preparing the composition, a method of forming the oxide thin film, and an electronic device including the oxide thin film.

Recently, researches have been widely conducted on oxide semiconductors which will replace typical silicon-based semiconductor devices. In terms of materials, results of the researches have been reported on single, binary, and tertiary compounds based on indium oxide ($In_2O_3$), zinc oxide (ZnO), and gallium oxide ($Ga_2O_3$) as the oxide semiconductors. Meanwhile, in process aspects of the oxide semiconductors, researches are conducted on a solution based process replacing typical vacuum deposition.

Indium oxide ($In_2O_3$) has been rapidly developed and used as a core material for transparent conductive oxides among the oxide semiconductors together with the advancement of a display field. However, researches on materials are required to replace indium oxide ($In_2O_3$) due to the imbalance of supply and demand, small reserves, high raw material cost, etc.

SUMMARY

Example embodiments of the inventive concept provide a low cost composition for an oxide thin film.

Example embodiments of the inventive concept also provide a process of preparing the composition for an oxide thin film.

Example embodiments of the inventive concept provide a method of forming the oxide thin film.

Example embodiments of the inventive concept provide an electronic device including the oxide thin film.

According to some example embodiments of the inventive concept, a composition for an oxide thin film may include a first compound containing tin; a second compound containing zinc; and a third compound containing a metal with an electronegativity lower than zinc.

In some embodiments, a total of the first compound, the second compound and the third compound may be included in a range of about 0.01 M to about 1 M.

In other embodiments, a molar ratio of the first compound to the second compound may be in a range of about 1:0.1 to about 0.1:1.

In still other embodiments, the number of moles of the third compound may be included within a half of the total number of moles of the first compound and the second compound. A molar ratio of the first compound:the second compound:the third compound may be in a range of about 7:4:0.1 to about 7:4:1. The molar ratio of the first compound:the second compound:the third compound may be in a range of about 7:4:0.3 to about 7:4:0.5.

In even other embodiments, the third compound may include a zirconium compound, an aluminum compound, a gallium compound, a neodymium compound, a chromium compound, a cerium compound, an yttrium compound, a tantalum compound, a titanium compound, a barium compound, a lanthanum compound, a manganese compound, a strontium compound, or combinations thereof.

In yet other embodiments, the zirconium compound may include zirconium acetate, zirconium nitrate, zirconium(II) hydride, zirconium(IV) acetate hydroxide, zirconium(IV) acetylacetonate, zirconium(IV) butoxide solution, zirconium (IV) carbide, zirconium(IV) chloride, zirconium(IV) ethoxide, zirconium(IV) fluoride, zirconium(IV) fluoride hydrate, zirconium(IV) hydroxide, zirconium(IV) iodide, zirconium (IV) sulfate hydrate, zirconium(IV) tert-butoxide, or combinations thereof.

In further embodiments, the aluminum compound may include aluminum acetate, aluminum acetylacetonate, aluminum borate, aluminum bromide, aluminum carbide, aluminum chloride, aluminum chloride hexahydrate, aluminum chloride hydrate, aluminum ethoxide, aluminum fluoride, aluminum hydroxide hydrate, aluminum iodide, aluminum isopropoxide, aluminum nitrate nonahydrate, aluminum nitride, aluminum phosphate, aluminum sulfate, aluminum sulfate hexadecahydrate, aluminum sulfate hydrate, aluminum tert-butoxide, or combinations thereof.

In still further embodiments, the gallium compound may include gallium nitride, gallium phosphide, gallium(II) chloride, gallium(III) acetylacetonate, gallium(III) bromide, gallium(III) chloride, gallium(III) fluoride, gallium(III) iodide, gallium(III) nitrate hydrate, gallium(III) sulfate, gallium(III) sulfate hydrate, or combinations thereof.

In even further embodiments, the neodymium compound may include neodymium(II) iodide, neodymium(III) acetate hydrate, neodymium(III) acetylacetonate hydrate, neodymium(III) bromide, neodymium(III) bromide hydrate, neodymium(III) carbonate hydrate, neodymium(III) chloride, neodymium(III) chloride hexahydrate, neodymium(III) fluoride, neodymium(III) hydroxide hydrate, neodymium (III) iodide, neodymium(III) isopropoxide, neodymium(III) nitrate hexahydrate, neodymium(III) nitrate hydrate, neodymium(III) oxalate hydrate, neodymium(III) phosphate hydrate, neodymium(III) sulfate, neodymium(III) sulfate hydrate, or combinations thereof.

In yet further embodiments, the tantalum compound may include tantalum bromide, tantalum chloride, tantalum fluoride, or combinations thereof.

In much further embodiments, the titanium compound may include titanium bromide, titanium chloride, titanium fluoride, or combinations thereof.

In still much further embodiments, the barium compound may include barium acetate, barium acetylacetonate, barium bromide, barium chloride, barium fluoride, barium hexafluoacetylacetonate, barium hydroxide, barium nitrate, or combinations thereof.

In even much further embodiments, the lanthanum compound may include lanthanum acetate, lanthanum acetylacetonate, lanthanum bromide, lanthanum chloride, lanthanum hydroxide, lanthanum fluoride, lanthanum nitrate, or combinations thereof.

In yet much further embodiments, the manganese compound may include manganese acetate, manganese acetylacetonate, manganese bromide, manganese chloride, manganese fluoride, manganese nitrate, or combinations thereof.

In some embodiments, the chromium compound may include chromium acetate, chromium acetylacetonate, chromium bromide, chromium chloride, chromium fluoride, chromium nitrate, or combinations thereof.

In other embodiments, the strontium compound may include strontium acetate, strontium acetylacetonate, strontium bromide, strontium chloride, strontium fluoride, strontium hydroxide, strontium nitrate, or combinations thereof.

In still other embodiments, the yttrium compound may include yttrium acetate, yttrium acetylacetonate, yttrium chloride, yttrium fluoride, yttrium nitrate, or combinations thereof.

In even other embodiments, the cerium compound may include cerium(III) acetate hydrate, cerium(III) acetylacetonate hydrate, cerium(III) bromide, cerium(III) carbonate hydrate, cerium(III) chloride, cerium(III) chloride heptahydrate, cerium(III) fluoride, cerium(III) iodide, cerium(III) nitrate hexahydrate, cerium(III) oxalate hydrate, cerium(III) sulfate, cerium(III) sulfate hydrate, cerium(III) sulfate octahydrate, cerium(IV) fluoride, cerium(IV) hydroxide, cerium(IV) sulfate, cerium(IV) sulfate hydrate, cerium(IV) sulfate tetrahydrate, or combinations thereof.

In yet other embodiments, the first compound including tin may include tin(II) chloride, tin(II) iodide, tin(II) chloride dihydrate, tin(II) bromide, tin(II) fluoride, tin(II) oxalate, tin(II) sulfide, tin(II) acetate, tin(IV) chloride, tin(IV) chloride pentahydrate, tin(IV) fluoride, tin(IV) iodide, tin(IV) sulfide, tin(IV) tert-butoxide, or combinations thereof.

In further embodiments, the second compound including zinc may include zinc citrate dihydrate, zinc acetate, zinc acetate dihydrate, zinc acetylacetonate hydrate, zinc acrylate, zinc chloride, zinc diethyldithiocarbamate, zinc dimethyldithiocarbamate, zinc fluoride, zinc fluoride hydrate, zinc hexafluoroacetylacetonate dihydrate, zinc methacrylate, zinc nitrate hexahydrate, zinc nitrate hydrate, zinc trifluoromethanesulfonate, zinc undecylenate, zinc trifluoroacetate hydrate, zinc tetrafluoroborate hydrate, zinc perchlorate hexahydrate, or combinations thereof.

In still further embodiments, the first compound, the second compound and the metal compound may be dissolved in one of solvents selected from the group consisting of isopropanol, 2-methoxyethanol, dimethylformamide, ethanol, deionized water, methanol, acetylacetone, dimethylamineborane, acetonitrile and combinations thereof.

According to some example embodiments of the inventive concept, a composition for an oxide thin film may include: a total of a tin compound, a zinc compound, and a zirconium compound in a range of about 0.01 M to about 1 M, wherein a molar ratio of the tin compound to the zinc compound is in a range of about 1:0.1 to about 0.1:1, and the number of moles of the zirconium compound may be included within a half of the total number of moles of the tin compound and the zinc compound.

In some embodiments, the tin compound may include tin(II) chloride, tin(II) iodide, tin(II) chloride dihydrate, tin(II) bromide, tin(II) fluoride, tin(II) oxalate, tin(II) sulfide, tin(II) acetate, tin(IV) chloride, tin(IV) chloride pentahydrate, tin(IV) fluoride, tin(IV) iodide, tin(IV) sulfide, tin(IV) tert-butoxide, or combinations thereof.

In other embodiments, the zinc compound may include zinc citrate dihydrate, zinc acetate, zinc acetate dihydrate, zinc acetylacetonate hydrate, zinc acrylate, zinc chloride, zinc diethyldithiocarbamate, zinc dimethyldithiocarbamate, zinc fluoride, zinc fluoride hydrate, zinc hexafluoroacetylacetonate dihydrate, zinc methacrylate, zinc nitrate hexahydrate, zinc nitrate hydrate, zinc trifluoromethanesulfonate, zinc undecylenate, zinc trifluoroacetate hydrate, zinc tetrafluoroborate hydrate, zinc perchlorate hexahydrate, or combinations thereof.

In still much further embodiments, the zirconium compound may include zirconium acetate, zirconium nitrate, zirconium(II) hydride, zirconium(IV) acetate hydroxide, zirconium(IV) acetylacetonate, zirconium(IV) butoxide solution, zirconium(IV) carbide, zirconium(IV) chloride, zirconium (IV) ethoxide, zirconium(IV) fluoride, zirconium(IV) fluoride hydrate, zirconium(IV) hydroxide, zirconium(IV) iodide, zirconium(IV) sulfate hydrate, zirconium(IV) tert-butoxide, or combinations thereof.

In even much further embodiments, a molar ratio of the tin compound:the zinc compound:the zirconium compound may be in a range of about 7:4:0.1 to about 7:4:1. The molar ratio of the tin compound:the zinc compound:the zirconium compound may be in a range of about 7:4:0.3 to about 7:4:0.5.

According to some embodiments of the inventive concept, a method of preparing a liquid phase for forming an oxide thin film may include: mixing a first compound containing tin, a second compound containing zinc, and a third compound containing a metal with an electronegativity lower than zinc in a solvent, wherein a total of the first compound, the second compound and the third compound is included in a range of about 0.01 M to about 1 M, a molar ratio of the first compound to the second compound is in a range of about 1:0.1 to about 0.1:1, and the number of moles of the third compound may be included within a half of the total number of moles of the first compound and the second compound.

In some embodiments, a molar ratio of the first compound: the second compound:the third compound may be in a range of about 7:4:0.1 to about 7:4:1.

In other embodiments, the third compound may include a zirconium compound, an aluminum compound, a gallium compound, a neodymium compound, a chromium compound, a cerium compound, an yttrium compound, a tantalum compound, a titanium compound, a barium compound, a lanthanum compound, a manganese compound, a strontium compound, or combinations thereof, the first compound may include tin(II) chloride, tin(II) iodide, tin(II) chloride dihydrate, tin(II) bromide, tin(II) fluoride, tin(II) oxalate, tin(II) sulfide, tin(II) acetate, tin(IV) chloride, tin(IV) chloride pentahydrate, tin(IV) fluoride, tin(IV) iodide, tin(IV) sulfide, tin(IV) tert-butoxide, or combinations thereof, and the second compound may include zinc citrate dihydrate, zinc acetate, zinc acetate dihydrate, zinc acetylacetonate hydrate, zinc acrylate, zinc chloride, zinc diethyldithiocarbamate, zinc dimethyldithiocarbamate, zinc fluoride, zinc fluoride hydrate, zinc hexafluoroacetylacetonate dihydrate, zinc methacrylate, zinc nitrate hexahydrate, zinc nitrate hydrate, zinc trifluoromethanesulfonate, zinc undecylenate, zinc trifluoroacetate hydrate, zinc tetrafluoroborate hydrate, zinc perchlorate hexahydrate, or combinations thereof.

In still other embodiments, the solvent may include isopropanol, 2-methoxyethanol, dimethylformamide, ethanol, deionized water, methanol, acetylacetone, dimethylamineborane, acetonitrile, or combinations thereof.

In even other embodiments of the inventive concept, an electronic device may include an oxide semiconductor thin film which includes tin, zinc, and a metal with an electronegativity lower than zinc.

In yet other embodiments, the oxide semiconductor thin film may include the tin and the zinc, wherein an atomic number ratio of the tin to the zinc is in a range of about 1:0.1 to about 0.1:1.

In further embodiments, the oxide semiconductor thin film may include the low electronegativity metal within a half of a total sum of the atomic numbers of the tin and the zinc.

In still further embodiments, the oxide semiconductor thin film may include the tin, the zinc, and the metal with a lower electronegativity than zinc, wherein the atomic number ratio of the tin:the zinc:the metal is in a range of about 7:4:0.1 to about 7:4:1.

In even further embodiments, the metal may include zirconium, aluminum, gallium, neodymium, chromium, cerium, yttrium, tantalum, titanium, barium, lanthanum, manganese, strontium, or combinations thereof.

According to some embodiments of the inventive concept, an electronic device may further include a gate electrode spaced apart from and overlapping an oxide semiconductor thin film, a source electrode electrically connected to the oxide semiconductor thin film and disposed at one end of the gate electrode, and a drain electrode electrically connected to the oxide semiconductor thin film and disposed at the other end of the gate electrode to face the source electrode.

According to some embodiments of the inventive concept, a method of forming an oxide thin film may include: preparing a solution for an oxide thin film; and applying the solution for an oxide thin film on a substrate.

In still much further embodiments, the preparing of the solution for an oxide thin film may include: preparing a first compound containing tin, a second compound containing zinc, and a third compound containing a metal with an electronegativity lower than zinc; and mixing the compounds in a solvent, wherein the first, the second, and the third compounds may be mixed in the solvent to include a total of the first compound, the second compound and the third compound in a range of about 0.01 M to about 1 M, a molar ratio of the first compound to the second compound in a range of about 1:0.1 to about 0.1:1, and the number of moles of the third compound within a half of the total number of moles of the first compound and the second compound.

In even much further embodiments, the third compound may include a zirconium compound, an aluminum compound, a gallium compound, a neodymium compound, a chromium compound, a cerium compound, an yttrium compound, a tantalum compound, a titanium compound, a barium compound, a lanthanum compound, a manganese compound, a strontium compound, or combinations thereof, the first compound may include tin(II) chloride, tin(II) iodide, tin(II) chloride dihydrate, tin(II) bromide, tin(II) fluoride, tin(II) oxalate, tin(II) sulfide, tin(II) acetate, tin(IV) chloride, tin(IV) chloride pentahydrate, tin(IV) fluoride, tin(IV) iodide, tin (IV) sulfide, tin(IV) tert-butoxide, or combinations thereof, and the second compound may include zinc citrate dihydrate, zinc acetate, zinc acetate dihydrate, zinc acetylacetonate hydrate, zinc acrylate, zinc chloride, zinc diethyldithiocarbamate, zinc dimethyldithiocarbamate, zinc fluoride, zinc fluoride hydrate, zinc hexafluoroacetylacetonate dihydrate, zinc methacrylate, zinc nitrate hexahydrate, zinc nitrate hydrate, zinc trifluoromethanesulfonate, zinc undecylenate, zinc trifluoroacetate hydrate, zinc tetrafluoroborate hydrate, zinc perchlorate hexahydrate, or combinations thereof.

In yet much further embodiments, the solvent may include isopropanol, 2-methoxyethanol, dimethylformamide, ethanol, deionized water, methanol, acetylacetone, dimethylamineborane, acetonitrile, or combinations thereof.

BRIEF DESCRIPTION OF THE DRAWINGS

The accompanying drawings are included to provide a further understanding of the exemplary embodiments of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION OF THE EMBODIMENTS

Figure 1A:
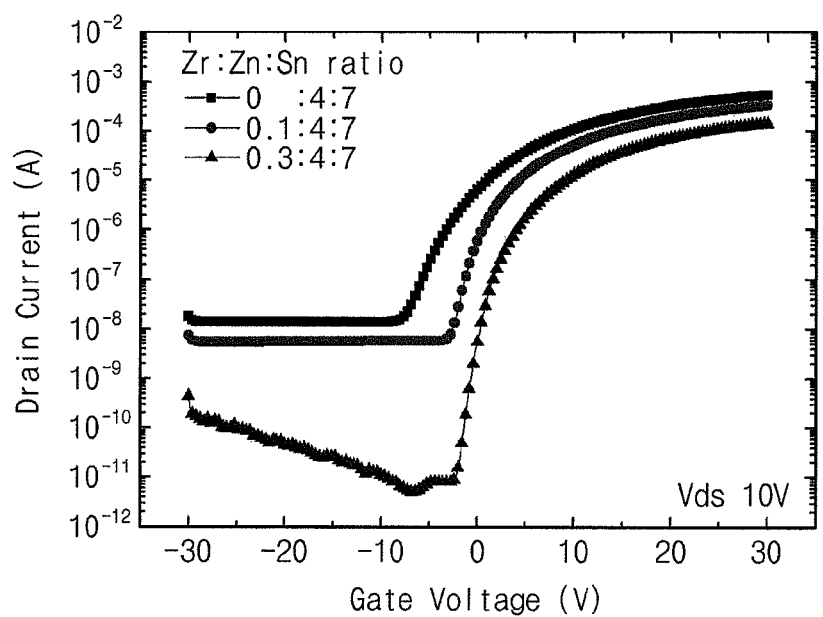
FIGS. 1A and 1B are graphs showing current-voltage characteristics of field-effect transistors using zirconium tin zinc oxides (ZrSnZnO) according to an embodiment of the inventive concept.

Embodiments of the inventive concept will be described below in more detail with reference to the accompanying drawings. The embodiments of the inventive concept may, however, be embodied in different forms and should not be constructed as limited to the embodiments set forth herein. Rather, these embodiments are provided so that this disclosure will be thorough and complete, and will fully convey the scope of the inventive concept to those skilled in the art.

Though not defined, all terms (including technical or scientific terms) used herein have the same meanings as those generally accepted by universal technologies in the related art to which the inventive concept pertains. The terms defined by general dictionaries may be construed as having the same meanings as those in the related art and/or the text of the present application, and will not be construed as being conceptualized or excessively formal although the terms are not clearly defined expressions herein.

In the following description, the technical terms are used only for explaining a specific exemplary embodiment while not limiting the inventive concept. The terms of a singular form may include plural forms unless referred to the contrary. The meaning of "include," "comprise," "including," or "comprising," specifies a property, a region, a fixed number, a step, a process, an element and/or a component but does not exclude other properties, regions, fixed numbers, steps, processes, elements and/or components.

The word 'and/or' means that one or more or a combination of relevant constituent elements is possible.

An embodiment of the inventive concept provides a low cost tin- and zinc-based oxide semiconductor capable of replacing a high cost indium-based oxide semiconductor. In order to further improve electrical properties of the tin- and zinc-based oxide semiconductor, an embodiment of the inventive concept adopts a low electronegativity metal compound including a metal with an electronegativity lower than zinc. For example, the low electronegativity metal compound may include a zirconium compound, an aluminum compound, a gallium compound, a neodymium compound, a cerium compound, an yttrium compound, a tantalum compound, a titanium compound, a barium compound, a lanthanum compound, a manganese compound, a chromium compound, a strontium compound, or combinations thereof, and it is not limited thereto. The metals included in the above-described metal compounds have low electronegativities and high free energies such that affinities with oxygen are high. Therefore, the metals can easily control a carrier concentration of the oxide semiconductor. Also, the metals exhibit high transmittances in a visible light spectrum because the metals have relatively wide bandgaps. Therefore, the metals can be applied to electronic devices such as a flexible device and a transparent electronic device.

Composition for Oxide Thin Film

A solution composition according to an embodiment of the inventive concept will be described. The solution composition according to an embodiment of the inventive concept may be a precursor solution used for forming an oxide semiconductor thin film.

The precursor solution according to an embodiment of the inventive concept includes a compound containing tin (Sn) (hereinafter, referred to as the 'tin compound'), a compound containing zinc (Zn) (hereinafter, referred to as the 'zinc compound'), and a low electronegativity metal compound containing a metal with an electronegativity lower than zinc.

The tin compound may be selected from tin salts and hydrates thereof, but it is not limited thereto. Specific examples of the tin compound may include tin(II) chloride, tin(II) iodide, tin(II) chloride dihydrate, tin(II) bromide, tin(II) fluoride, tin(II) oxalate, tin(II) sulfide, tin(II) acetate, tin(IV) chloride, tin(IV) chloride pentahydrate, tin(IV) fluoride, tin(IV) iodide, tin(IV) sulfide, tin(IV) tert-butoxide, and hydrates thereof, and the tin compound may include one or more selected from the above-described compounds.

The zinc compound may be selected from zinc salts and hydrates thereof, but it is not limited thereto. Specific examples of the zinc compound may include zinc citrate dihydrate, zinc acetate, zinc acetate dihydrate, zinc acetylacetonate hydrate, zinc acrylate, zinc chloride, zinc diethyldithiocarbamate, zinc dimethyldithiocarbamate, zinc fluoride, zinc fluoride hydrate, zinc hexafluoroacetylacetonate dihydrate, zinc methacrylate, zinc nitrate hexahydrate, zinc nitrate hydrate, zinc trifluoromethanesulfonate, zinc undecylenate, zinc trifluoroacetate hydrate, zinc tetrafluoroborate hydrate, zinc perchlorate hexahydrate, and hydrates thereof, and the zinc compound may include one or more selected from the above-described compounds.

Examples of the low electronegativity metal compound may include a compound containing zirconium (hereinafter the 'zirconium compound'), a compound containing aluminum (hereinafter the 'aluminum compound'), a compound containing gallium (hereinafter the 'gallium compound'), a compound containing neodymium (hereinafter the 'neodymium compound'), a compound containing chromium (hereinafter the 'chromium compound'), a compound containing cerium (hereinafter the 'cerium compound'), a compound containing yttrium (hereinafter the 'yttrium compound'), a compound containing tantalum (hereinafter the 'tantalum compound'), a compound containing titanium (hereinafter the 'titanium compound'), a compound containing barium (hereinafter the 'barium compound'), a compound containing lanthanum (hereinafter the 'lanthanum compound'), a compound containing manganese (hereinafter the 'manganese compound'), a compound containing strontium (hereinafter the 'strontium compound'), etc., and the low electronegativity metal compound may include one or more selected from the above-described compounds.

The zirconium compound may be selected from zirconium salts and hydrates thereof, but it is not limited thereto. Specific examples of the zirconium compound may include zirconium acetate, zirconium nitrate, zirconium(II) hydride, zirconium(IV) acetate hydroxide, zirconium(IV) acetylacetonate, zirconium(IV) butoxide solution, zirconium(IV) carbide, zirconium(IV) chloride, zirconium(IV) ethoxide, zirconium(IV) fluoride, zirconium(IV) fluoride hydrate, zirconium(IV) hydroxide, zirconium(IV) iodide, zirconium(IV) sulfate hydrate, zirconium(IV) tert-butoxide, and hydrates thereof, and the zirconium compound may include one or more selected from the above-described compounds.

The aluminum compound may be selected from aluminum salts and hydrates thereof, but it is not limited thereto. Specific examples of the aluminum compound may include aluminum acetate, aluminum acetylacetonate, aluminum borate, aluminum bromide, aluminum carbide, aluminum chloride, aluminum chloride hexahydrate, aluminum chloride hydrate, aluminum ethoxide, aluminum fluoride, aluminum hydroxide hydrate, aluminum iodide, aluminum isopropoxide, aluminum nitrate nonahydrate, aluminum nitride, aluminum phosphate, aluminum sulfate, aluminum sulfate hexadecahydrate, aluminum sulfate hydrate, aluminum tert-butoxide, and hydrates thereof, and the aluminum compound may include one or more selected from the above-described compounds.

The gallium compound may be selected from gallium salts and hydrates thereof, but it is not limited thereto. Specific examples of the gallium compound may include gallium nitride, gallium phosphide, gallium(II) chloride, gallium(III) acetylacetonate, gallium(III) bromide, gallium(III) chloride, gallium(III) fluoride, gallium(III) iodide, gallium(III) nitrate hydrate, gallium(III) sulfate, gallium(III) sulfate hydrate, and hydrates thereof, and the gallium compound may include one or more selected from the above-described compounds.

The neodymium compound may be selected from neodymium salts and hydrates thereof, but it is not limited thereto. Specific examples of the neodymium compound may include neodymium(II) iodide, neodymium(III) acetate hydrate, neodymium(III) acetylacetonate hydrate, neodymium(III) bromide, neodymium(III) bromide hydrate, neodymium(III) carbonate hydrate, neodymium(III) chloride, neodymium(III) chloride hexahydrate, neodymium(III) fluoride, neodymium(III) hydroxide hydrate, neodymium(III) iodide, neodymium(III) isopropoxide, neodymium(III) nitrate hexahydrate, neodymium(III) nitrate hydrate, neodymium(III) oxalate hydrate, neodymium(III) phosphate hydrate, neodymium(III) sulfate, neodymium(III) sulfate hydrate, and hydrates thereof, and the neodymium compound may include one or more selected from the above-described compounds.

The tantalum compound may be selected from tantalum salts and hydrates thereof, but it is not limited thereto. Specific examples of the tantalum compound may include tantalum bromide, tantalum chloride, tantalum fluoride, and hydrates thereof, and the tantalum compound may include one or more selected from the above-described compounds.

The titanium compound may be selected from titanium salts and hydrates thereof; but it is not limited thereto. Specific examples of the titanium compound may include titanium bromide, titanium chloride, titanium fluoride, and hydrates thereof, and the titanium compound may include one or more selected from the above-described compounds.

The barium compound may be selected from barium salts and hydrates thereof, but it is not limited thereto. Specific examples of the barium compound may include barium acetate, barium acetylacetonate, barium bromide, barium chloride, barium fluoride, barium hexafluoacetylacetonate, barium hydroxide, barium nitrate, and hydrates thereof, and the barium compound may include one or more selected from the above-described compounds.

The lanthanum compound may be selected from lanthanum salts and hydrates thereof, but it is not limited thereto. Specific examples of the lanthanum compound may include lanthanum acetate, lanthanum acetylacetonate, lanthanum bromide, lanthanum chloride, lanthanum hydroxide, lanthanum fluoride, lanthanum nitrate, and hydrates thereof, and the lanthanum compound may include one or more selected from the above-described compounds.

The manganese compound may be selected from manganese salts and hydrates thereof, but it is not limited thereto. Specific examples of the manganese compound may include manganese acetate, manganese acetylacetonate, manganese bromide, manganese chloride, manganese fluoride, manganese nitrate, and hydrates thereof, and the manganese compound may include one or more selected from the above-described compounds.

The chromium compound may be selected from chromium salts and hydrates thereof, but it is not limited thereto. Specific examples of the chromium compound may include chromium acetate, chromium acetylacetonate, chromium bromide, chromium chloride, chromium fluoride, chromium nitrate, and hydrates thereof, and the chromium compound may include one or more selected from the above-described compounds.

The strontium compound may be selected from strontium salts and hydrates thereof, but it is not limited thereto. Specific examples of the strontium compound may include strontium acetate, strontium acetylacetonate, strontium bromide, strontium chloride, strontium fluoride, strontium hydroxide, strontium nitrate, and hydrates thereof, and the strontium compound may include one or more selected from the above-described compounds.

The yttrium compound may be selected from yttrium salts and hydrates thereof, but it is not limited thereto. Specific examples of the yttrium compound may include yttrium acetate, yttrium acetylacetonate, yttrium chloride, yttrium fluoride, yttrium nitrate, and hydrates thereof, and the yttrium compound may include one or more selected from the above-described compounds.

The cerium compound may be selected from cerium salts and hydrates thereof, but it is not limited thereto. Specific examples of the cerium compound may include cerium(III) acetate hydrate, cerium(III) acetylacetonate hydrate, cerium (III) bromide, cerium(III) carbonate hydrate, cerium(III) chloride, cerium(III) chloride heptahydrate, cerium(III) fluoride, cerium(III) iodide, cerium(III) nitrate hexahydrate, cerium(III) oxalate hydrate, cerium(III) sulfate, cerium(III) sulfate hydrate, cerium(III) sulfate octahydrate, cerium(IV) fluoride, cerium(IV) hydroxide, cerium(IV) sulfate, cerium (IV) sulfate hydrate, cerium(IV) sulfate tetrahydrate, and hydrates thereof, and the cerium compound may include one or more selected from the above-described compounds.

The tin compound, the zinc compound, and the metal compound may be used in various combinations. For example, tin(II) chloride may be used as the tin compound, zinc acetate dihydrate may be used as the zinc compound, and zirconium (IV) chloride may be used as the metal compound.

The tin compound, the zinc compound, and the metal compound are mixed in a solvent to prepare a precursor solution. For example, the solvent may include one or more selected from the group consisting of deionized water, methanol, ethanol, propanol, isopropanol, 2-methoxyethanol, 2-ethoxyethanol, 2-proxyethanol, 2-butoxyethanol, methyl cellosolve, ethyl cellosolve, diethylene glycol methyl ether, diethylene glycol ethyl ether, dipropylene glycol methyl ether, toluene, xylene, hexane, heptane, octane, ethyl acetate, butyl acetate, diethylene glycol dimethyl ether, diethylene glycol dimethyl ethyl ether, methyl methoxypropionic acid, ethyl ethoxypropionic acid, ethyl lactic acid, propylene glycol methyl ether acetate, propylene glycol methyl ether, propylene glycol propyl ether, methyl cellosolve acetate, ethyl cellosolve acetate, diethylene glycol methyl acetate, diethylene glycol ethyl acetate, acetone, methyl isobutyl ketone, cyclohexanone, dimethylformamide (DMF), N,N-dimethylacetamide (DMAc), N-methyl-2-pyrrolidone, γ-butyrolactone, diethyl ether, ethylene glycol dimethyl ether, diglyme, tetrahydrofuran, acetylacetone, and acetonitrile.

The above-described tin compound, zinc compound, and zirconium compound are precursors of the oxide semiconductor thin film, and may grow into a zinc tin zirconium oxide (ZnTinZrO) thin film including tin, zinc, and zirconium through heat treatment or the like as described below. Since the oxide semiconductor thin film is formed from a solution form, fabrication processes can be simplified without performing complex and high cost processes such as vacuum deposition.

According to an embodiment of the inventive concept, the precursor solution may further include a stabilizer. The stabilizer may include one or more selected from the group consisting of an alcohol amine compound, an alkyl ammonium hydroxy compound, an alkyl amine compound, a ketone compound, an acidic compound, a basic compound, deionized water, etc. Examples of the stabilizer may include one or more selected from the group consisting of monoethanolamine, diethanolamine, triethanolamine, monoisopropylamine, N,N-methylethanolamine, aminoethylethanolamine, diethyleneglycolamine, 2-(aminoethoxy)ethanol, N-t-butylethanolamine, N-t-butyldiethanolamine, tetramethylammoniumhydroxide, methylamine, ethylamine, acetylacetone, hydrochloric acid, nitric acid, sulfuric acid, acetic acid, ammonium hydroxide, potassium hydroxide and sodium hydroxide. The stabilizer may be included in the precursor solution to increase solubilities of other components. Therefore, the oxide semiconductor thin film obtained from the precursor solution may be uniformly formed. The content of the solution stabilizer may be changed according to the types and contents of the above-described other components. For example, the solution stabilizer may be included in a range of about 0.01 M to about 2M.

The tin compound, the zinc compound, and the low electronegativity metal compound may be included in a range of about 0.01 M to about 1 M in the precursor solution according to an embodiment.

The molar ratio of the tin compound to the zinc compound in the precursor solution is in a range of about 1:0.1 to about 0.1:1, and the ratio may be identically maintained at an atomic number ratio of tin to zinc after the forming of the oxide thin film. Meanwhile, the number of moles of the low electronegativity metal compound is included within a half of the total number of moles of the tin compound and the zinc compound. Likewise, a ratio of the number of moles therebetween may be identically maintained at an atomic number ratio of tin, zinc and low electronegativity metal after the forming of the oxide thin film.

For example, the molar ratio of the tin compound:the zinc compound:the low electronegativity metal compound may be in a range of about 7:4:0.1 to about 7:4:1.

For example, the molar ratio of the tin compound:the zinc compound:the low electronegativity metal compound may be in a range of about 7:4:0.3 to about 7:4:0.5.

When the oxide semiconductor formed from the precursor solution is applied to an electronic device such as a thin film transistor, the low electronegativity metal compound, e.g., a zirconium compound, may act as a factor controlling a flicker rate, a carrier mobility, a threshold voltage and/or a turn-on voltage of the electronic device. Therefore, according to an embodiment of the inventive concept, an electronic device, which has high flicker rate, high carrier mobility, low turn-on voltage variation, and/or low threshold voltage variation or the like, may be formed.

Preparation of Precursor Solution Containing Tin, Zinc, and Zirconium

Example 1

2-methoxyethanol was used as a solvent, and about 0.25 M of tin chloride, zinc acetate dihydrate, and zirconium chloride was prepared with respect to the solvent 2-methoxyethanol in order that a molar ratio of tin:zinc:zirconium became about 7:4:0.1. The tin chloride, zinc acetate dihydrate, and zirconium chloride were put into a 2-methoxyethanol solvent, respectively, and then aging for stabilization was performed for about 24 hours after putting mono-ethanolamine and acetic acid ($CH_3COOH$) as stabilizers of a sol. Subsequently, the sol was stirred at a rate of about 200 rpm for about 30 minutes by using a magnetic bar at a hot plate temperature of about 70° C. The solution sufficiently stirred exhibited a colorless and transparent form, and impurities in the solution were filtered by using a 0.25 μm filter.

Example 2

2-methoxyethanol was used as a solvent and about 0.25 M of tin chloride, zinc acetate dihydrate, and zirconium chloride with respect to the solvent 2-methoxyethanol was prepared in order that a molar ratio of tin:zinc:zirconium became about 7:4:0.3 in 2-methoxyethanol solution. The tin chloride, zinc acetate dihydrate, and zirconium chloride were put into a 2-methoxyethanol solvent, respectively, and then aging for stabilization was performed for about 24 hours after putting mono-ethanolamine and acetic acid ($CH_3COOH$) as stabilizers of a sol. Subsequently, the sol was stirred at a rate of about 200 rpm for about 30 minutes by using a magnetic bar at a hot plate temperature of about 70° C. The solution sufficiently stirred exhibited a colorless and transparent form, and impurities in the solution were filtered by using a 0.25 μm filter.

Example 3

2-methoxyethanol was used as a solvent and about 0.25 M of tin chloride, zinc acetate dihydrate, and zirconium chloride with respect to the solvent 2-methoxyethanol was prepared in order that a molar ratio of tin:zinc:zirconium became about 7:4:0.5 in 2-methoxyethanol solution. The tin chloride, zinc acetate dihydrate, and zirconium chloride were put into a 2-methoxyethanol solvent, respectively, and then aging for stabilization was performed for about 24 hours after putting mono-ethanolamine and acetic acid ($CH_3COOH$) as stabilizers of a sol. Subsequently, the sol was stirred at a rate of about 200 rpm for about 30 minutes by using a magnetic bar at a hot plate temperature of about 70° C. The solution sufficiently stirred exhibited a colorless and transparent form, and impurities in the solution were filtered by using a 0.25 μm filter.

Example 4

2-methoxyethanol was used as a solvent and about 0.25 M of tin chloride, zinc acetate dihydrate, and zirconium chloride with respect to the solvent 2-methoxyethanol was prepared in order that a molar ratio of tin:zinc:zirconium became about 7:4:1 in 2-methoxyethanol solution. The tin chloride, zinc acetate dihydrate, and zirconium chloride were put into a 2-methoxyethanol solvent, respectively, and then aging for stabilization was performed for about 24 hours after putting mono-ethanolamine and acetic acid ($CH_3COOH$) as stabilizers of a sol. Subsequently, the sol was stirred at a rate of about 200 rpm for about 30 minutes by using a magnetic bar at a hot plate temperature of about 70° C. The solution sufficiently stirred exhibited a colorless and transparent form, and impurities in the solution were filtered by using a 0.25 μm filter.

Comparative Example

Except that zirconium is not included, a precursor solution was prepared in the same manner as in the above-described Examples.

Thin Film Transistor Fabrication

A thin film transistor is fabricated by using a precursor solution prepared as the above. About 2000 Å of molybdenum tungsten (MoW) is deposited on a glass substrate, and a gate electrode is formed by photolithography. About 2000 Å of silicon nitride is deposited by a chemical vapor deposition method to form a gate dielectric. Pre-annealing is performed after spin coating the precursor solution prepared according to the above-described Examples and Comparative Example on the gate dielectric. At this time, the spin coating is performed in five steps such as at 500 rpm for 10 seconds, at 1500 rpm for 10 seconds, at 3000 rpm for 30 seconds, at 1500 rpm for 10 seconds, and at 500 rpm for 5 seconds, and the pre-annealing is performed on a hot plate at about 300° C. for about 5 minutes. Next, a zirconium tin zinc oxide (ZrSnZnO: ZTZO) semiconductor thin film and a tin zinc oxide (SnZnO: TZO) semiconductor thin film are grown by subjecting the substrate to heat treatment in a furnace at about 550° C. for about 2 hours. Subsequently, source electrode and drain electrode are formed by stacking and photolithography of about 1000 Å of tantalum.

Performance Evaluation 1

Threshold voltage, current ratio, charge mobility and subthreshold swing were evaluated according to zirconium contents in the thin film transistors prepared by using the precursor solutions according to the above-described Examples and Comparative Example.

Evaluation results are described with reference to Table 1 below.

TABLE 1

| Zr:Zn:Sn | Charge mobility ($cm^2/Vs$) | On/off current ratio | Threshold voltage (V) | Subthreshold swing (V/dec.) |
| --- | --- | --- | --- | --- |
| 0:4:7 (Comparative Example) | 5.84 | $3.7 \times 10^3$ | 4.31 | 2.65 |
| 0.1:4:7 (Example 1) | 4.5 | $6.0 \times 10^4$ | 2.68 | 1.38 |

TABLE 1-continued

| Zr:Zn:Sn | Charge mobility (cm²/Vs) | On/off current ratio | Threshold voltage (V) | Subthreshold swing (V/dec.) |
|---|---|---|---|---|
| 0.3:4:7 (Example 2) | 2.18 | $2.9 \times 10^7$ | 5.13 | 0.78 |
| 0.5:4:7 (Example 3) | 2.03 | $1.9 \times 10^6$ | 12.28 | 0.94 |
| 1:4:7 (Example 4) | 0.14 | $5.2 \times 10^5$ | 14.06 | 1.02 |

Referring to Table 1, it can be confirmed that the on/off characteristics of the thin film transistors and the subthreshold swing values are improved as the zirconium content is increased. Specifically, relatively excellent properties are exhibited when a ratio of the number of moles of tin:zinc:zirconium is in a range of about 7:4:0.3 to about 7:4:0.5. Particularly, when the ratio of the number of moles of tin:zinc:zirconium is about 7:4:0.3, the thin film transistor exhibits very good characteristics, in which the charge mobility, threshold voltage, on/off current ratio, and subthreshold swing are about 2.18 cm²/Vs, about 5.13 V, about $2.9 \times 10^7$, and about 0.78 V/dec, respectively. Therefore, it can be understood that the characteristics of the thin film transistor are improved when the zirconium tin zinc oxide is used for the semiconductor thin film.

Performance Evaluation 2

I-V characteristics were evaluated according to zirconium contents in the thin film transistors prepared by using the precursor solutions according to the above-described Examples and Comparative Example.

Figure 1B:
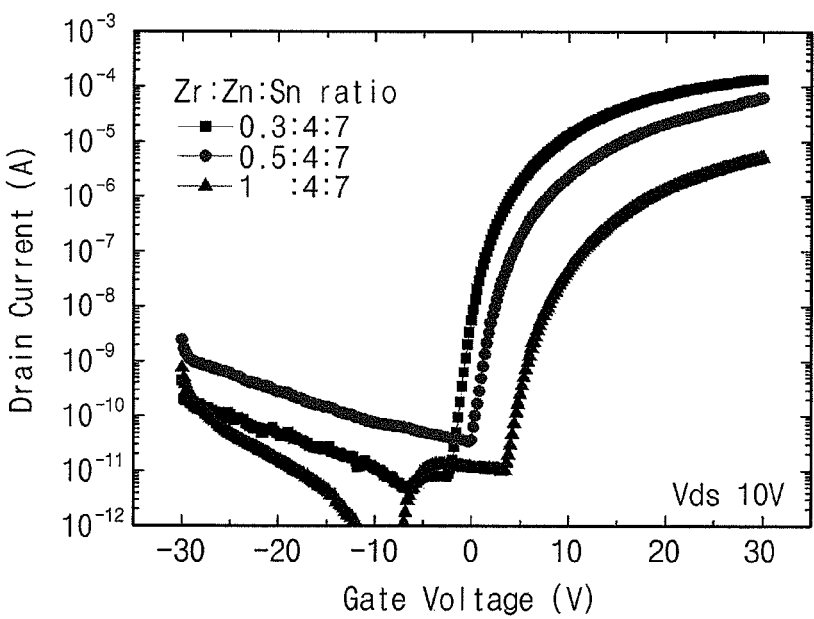

Evaluation results are described with reference to FIGS. 1A and 1B. Referring to FIGS. 1A and 1B, tin zinc oxide exhibits a high leakage current distribution when there is no zirconium content. Thus, the tin zinc oxide exhibits a low on/off current ratio. However, when zirconium is added, it can be confirmed that a high on/off current ratio is exhibited while the leakage current is considerably decreased. It is estimated that the electron concentration is controlled by adding zirconium. It is estimated that the electron concentration is controlled through high oxidizing power by the adding of the zirconium having a high oxygen affinity, i.e., low electronegativity.

Performance Evaluation 3

Optical transmittances in the visible light spectrum were evaluated according to zirconium contents in the thin film transistors prepared by using the precursor solutions according to the above-described Examples and Comparative Example. Evaluation results are described with reference to FIG. 2.

Figure 2:
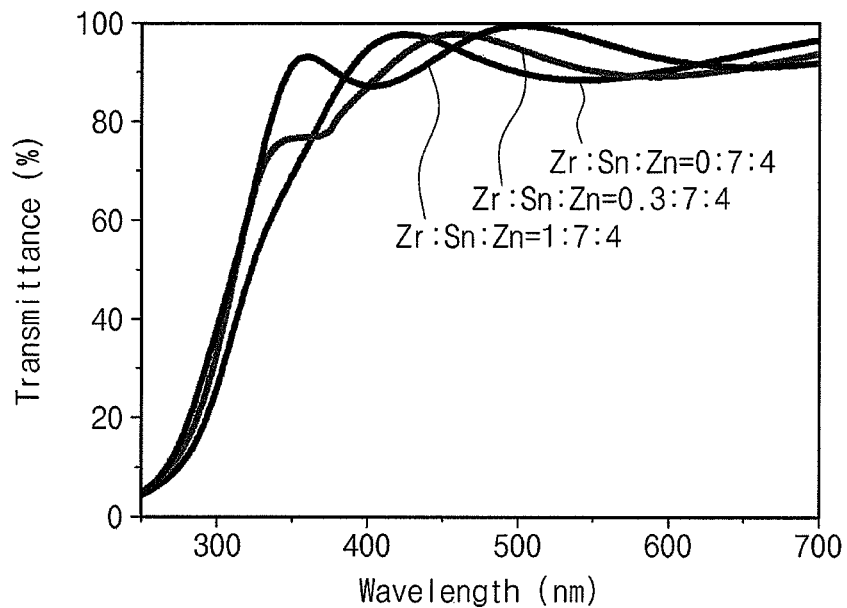
FIG. 2 is a graph showing optical transmittances of zirconium tin zinc oxide (ZrSnZnO) thin films according to an embodiment of the inventive concept.

Referring to FIG. 2, it can be confirmed that the average transmittance of the thin film transistors is about 90% or more in the visible light spectrum. The excellent optical transmittance characteristics in the visible light spectrum are very useful when the thin film transistor according to the present embodiment is applied to a flexible substrate.

Performance Evaluation 4

Optical bandgaps were evaluated according to zirconium contents in the thin film transistors prepared by using the precursor solutions according to the above-described Examples and Comparative Example. Evaluation results are described with reference to FIG. 3.

Figure 3:
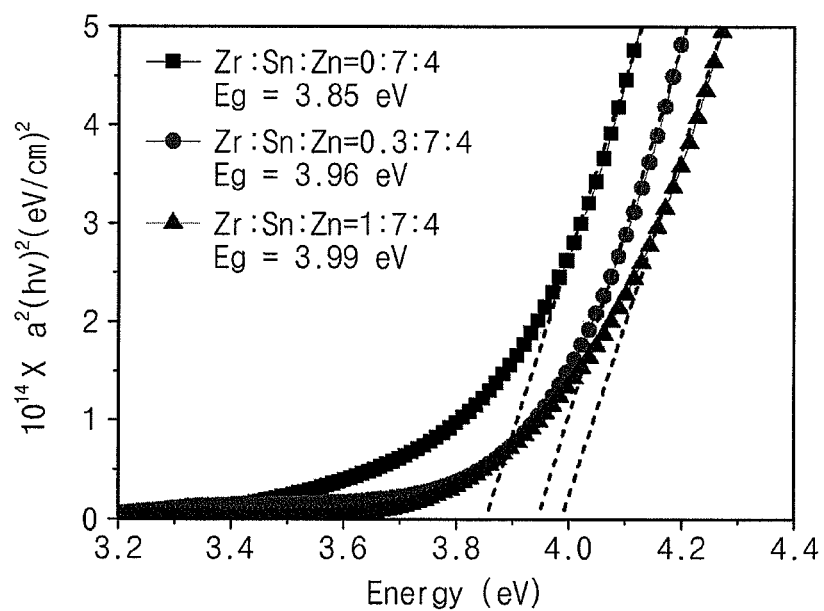
FIG. 3 is a graph showing broad bandwidths of zirconium tin zinc oxide (ZrSnZnO) thin films according to an embodiment of the inventive concept.

Referring to FIG. 3, it can be understood that the optical bandgap is larger as the zirconium content increases. Zirconium serves to improve the stability and reliability of an electronic device by controlling the carrier concentration.

Performance Evaluation 5

Bias stress tests were performed according to zirconium contents in the thin film transistors prepared by using the precursor solutions according to the above-described Examples and Comparative Example. Test results are described with reference to FIGS. 4A and 4B.

Figure 4A:
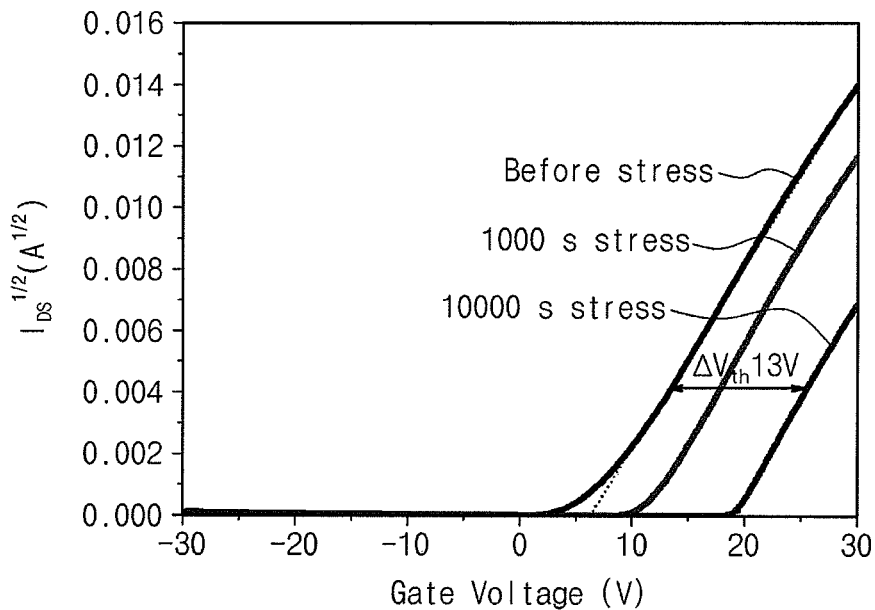
FIG. 4A is a graph showing a result of bias stress tests on a thin film transistor (ZTO thin film transistor) manufactured by using a precursor solution (the precursor solution that does not include zirconium) according to Comparative Example.
Figure 4B:
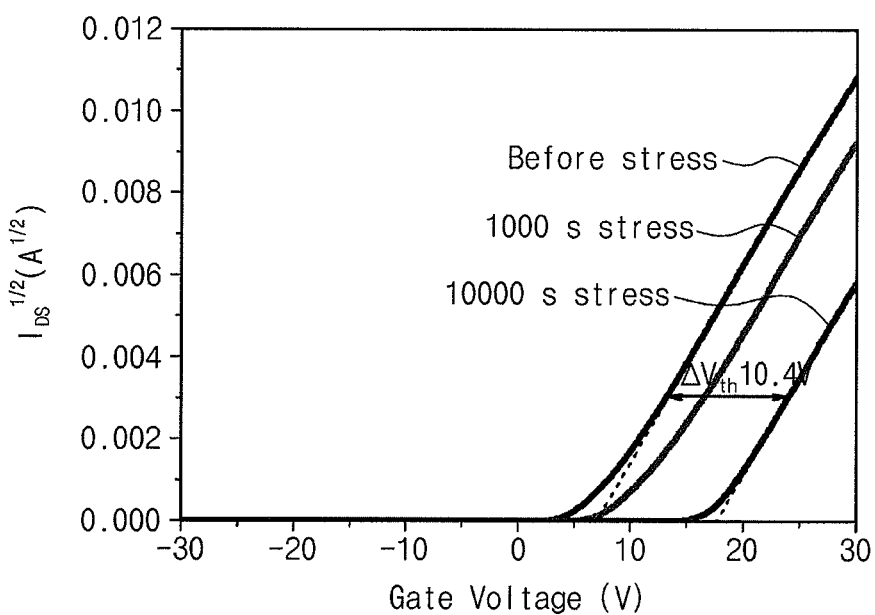
FIG. 4B is a graph showing a result of bias stress tests on a thin film transistor (ZTZO thin film transistor) manufactured by using a precursor solution (the precursor solution including zirconium) according to an embodiment of the inventive concept.

FIG. 4A shows a result of bias stress tests on a thin film transistor (ZTO thin film transistor) manufactured by using a precursor solution (the precursor solution that does not include zirconium) according to the Comparative Example, and FIG. 4B shows a result of bias stress tests on a thin film transistor (ZTZO thin film transistor) manufactured by using a precursor solution (the precursor solution including zirconium) according to the above-described embodiments.

The voltage ($V_{GS}$) between the gate-source and the voltage ($V_{DS}$) between the source-drain are fixed to about 20 V and about 10 V, respectively, and are applied for about 1000 seconds and about 10000 seconds, respectively. Then, device characteristics of the transistors were measured. Referring to FIGS. 4A and 4B, the results show that the change of the threshold voltage during 10000 seconds of stress time is further decreased by about 2.6 V in the case of the ZTZO (ZrSnZnO) thin film transistor including zirconium than the case of the ZTO(ZnSnO) thin film transistor that does not include zirconium. Accordingly, it can be confirmed that device stability is increased as zirconium is doped.

Hereinafter, Implementation Example, which applies zirconium tin zinc oxide (ZrSnZnO:ZTZO) to a thin film transistor, is described with reference to the accompanying drawings.

Figure 5:
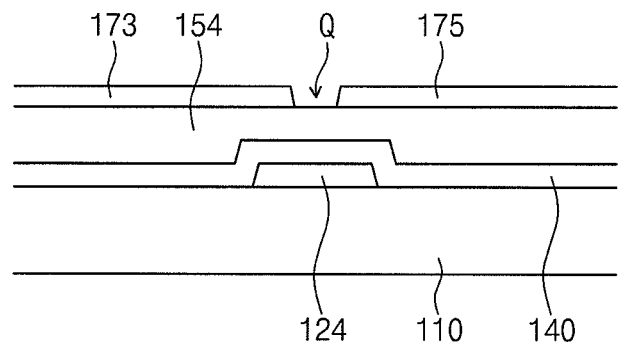
FIG. 5 is a cross-sectional view illustrating a thin film transistor according to an Implementation Example of the inventive concept.

FIG. 5 is a cross-sectional view illustrating a thin film transistor according to an Implementation Example of the inventive concept. Referring to FIG. 5, in the thin film transistor according to the Implementation Example of the inventive concept, a gate electrode 124 is formed on a substrate 110 and a gate dielectric 140 covering a surface of the substrate is formed on the gate electrode 124.

An oxide semiconductor 154 overlapping the gate electrode 124 is formed on the gate dielectric 140. The oxide semiconductor 154 is formed of the above-described zirconium tin zinc oxide (ZrSnZnO:ZTZO) including tin (Sn), zinc (Zn), and zirconium (Zr). The oxide semiconductor 154 may control the carrier concentration with the number of oxygen vacancies. Since zirconium may decrease the oxygen vacancies during oxidation due to the strong oxidizing power in its ionic state, zirconium may easily control the carrier concentration. Also, since zirconium has a wide bandgap when oxidized, conductivity becomes greatly decreased in an off state. Thus, zirconium can decrease the leakage current. Therefore, threshold voltage and current characteristics can be improved when the zirconium tin zinc oxide (ZrSnZnO:ZTZO) is applied as a semiconductor in an electronic device such as the thin film transistor.

Source electrode 173 and drain electrode 175 facing to each other are formed on the oxide semiconductor 154. The source electrode 173 and the drain electrode 175 are electrically connected to the oxide semiconductor 154 during turn-on. At this time, a channel Q of the thin film transistor is formed on the oxide semiconductor 154 between the source electrode 173 and the drain electrode 175.

Hereinafter, a method of fabricating a thin film transistor is described with reference to FIGS. 6 through 8 together with FIG. 5.

Figure 6:
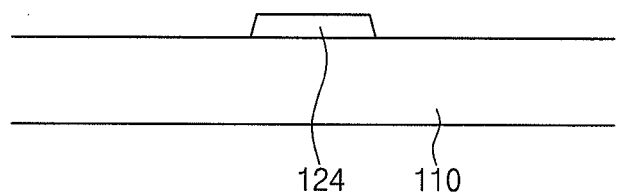
FIGS. 6 through 8 are cross-sectional views sequentially illustrating a method of fabricating the thin film transistor of FIG. 5.
Figure 8:
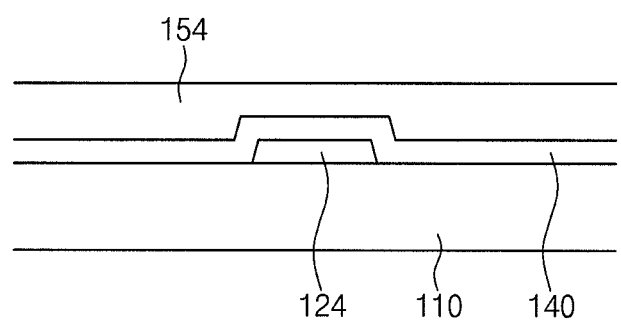

FIGS. 6 and 8 are cross-sectional views sequentially illustrating a method of fabricating the thin film transistor of FIG. 5.

Before fabricating the thin film transistor, a precursor solution of zirconium tin zinc oxide (ZrSnZnO) is first prepared by mixing the above-described tin compound, zinc compound, and zirconium compound in a solvent. The pH of the precursor solution may be in a range of about 1 to about 10, specifically about 3.8 to about 4.2. At this time, each component is mixed in the solvent, and then the precursor solution may be stirred, e.g., at room temperature (about 25° C.) to about 100° C. for about 1 to 100 hours. The stirring may be performed by using a stirrer or ultrasonic waves. Thus, solubility and thin-film coatability may be improved by performing the stirring process. Subsequently, an aging process may be further performed during about 1 to about 240 hours. The precursor solution thus prepared may be a sol form.

Referring to FIG. 6, a conductive layer is stacked on a substrate 110 formed of glass, silica, or plastic, and then a gate electrode 124 is formed by performing photolithography on the conductive layer.

Figure 7:
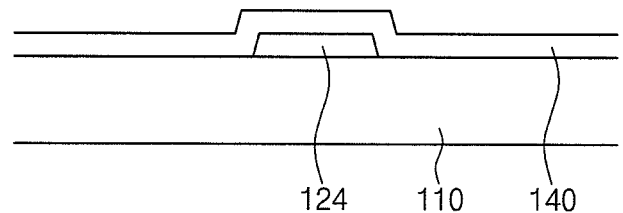

Next, referring to FIG. 7, a gate dielectric 140 is formed by stacking silicon oxide ($SiO_2$), silicon nitride ($SiN_x$), or an organic insulation layer on the gate electrode 124.

Referring to FIG. 8, an oxide semiconductor 154 is formed on the gate dielectric 140. The oxide semiconductor 154 is formed of the precursor solution of zirconium tin zinc oxide (ZrSnZnO) by using a method such as spin coating, slit coating, inkjet printing, spray, dipping, roll-to-roll, or nano imprint.

Subsequently, the precursor solution is subjected to heat treatment to grow into a zirconium tin zinc oxide (ZrSnZnO) thin film. At this time, the solution in a sol state is made to a gel state by prebaking at a relatively low temperature, and then heat treatment may be performed at high temperatures.

Referring to FIG. 5, a conductive layer is stacked on the oxide semiconductor 154, and then source electrode 173 and drain electrode 175 are formed by performing photolithography on the conductive layer.

While only the thin film transistor having a bottom gate structure is exemplarily described in the above-described embodiments, it is not limited thereto and may be identically applied to thin film transistors having any structures such as a thin film transistor having a top gate structure. Also, the application of the oxide semiconductors to the thin film transistor is exemplarily described in the above-described embodiments, but it is not limited thereto and may be identically applied to any electronic devices which require a semiconductor thin film.

According to embodiments of the inventive concept, fabrication processes can be simplified and fabrication costs can be reduced because an oxide semiconductor can be formed by using a liquid phase.

According to embodiments of the inventive concept, a lower cost electronic device can be fabricated by using tin, compared to indium.

According to embodiments of the inventive concept, a material with low electronegativity such as zirconium is added on a basis of tin and zinc. Therefore, a reliable device having excellent electrical characteristics, such as high field-effect mobility, high flicker rate, and good on/off current characteristic, can be fabricated.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the above-described detailed description.

What is claimed is:

1. A composition for an oxide film, comprising:
   a first compound containing tin;
   a second compound containing zinc; and
   a third compound containing zirconium, wherein a total of the first compound, the second compound, and the third compound is in a range of about 0.01 M to about 1 M, a molar ratio of the first compound to the second compound is in a range of about 1:0.1 to about 0.1:1, and the number of moles of the third compound is half of the total number of moles of the first compound and the second compound.

2. The composition of claim 1, wherein a molar ratio of the first compound:the second compound:the third compound is in a range of about 7:4:0.1 to about 7:4:1.

3. The composition of claim 1, wherein the molar ratio of the first compound:the second compound:the third compound is in a range of about 7:4:0.3 to about 7:4:0.5.

4. The composition of claim 1, wherein the zirconium compound comprises zirconium acetate, zirconium nitrate, zirconium(II) hydride, zirconium(IV) acetate hydroxide, zirconium(IV) acetylacetonate, zirconium(IV) butoxide solution, zirconium(IV) carbide, zirconium(IV) chloride, zirconium(IV) ethoxide, zirconium(IV) fluoride, zirconium(IV) fluoride hydrate, zirconium(IV) hydroxide, zirconium(IV) iodide, zirconium(IV) sulfate hydrate, zirconium(IV) tert-butoxide, or combinations thereof.

5. The composition of claim 1, wherein the first compound comprises tin(II) chloride, tin(II) iodide, tin(II) chloride dihydrate, tin(II) bromide, tin(II) fluoride, tin(II) oxalate, tin(II) sulfide, tin(II) acetate, tin(IV) chloride, tin(IV) chloride pentahydrate, tin(IV) fluoride, tin(IV) iodide, tin(IV) sulfide, tin(IV) tert-butoxide, or combinations thereof.

6. The composition of claim 5, wherein the third compound comprises zirconium acetate, zirconium nitrate, zirconium(II) hydride, zirconium(IV) acetate hydroxide, zirconium(IV) acetylacetonate, zirconium(IV) butoxide solution, zirconium(IV) carbide, zirconium(IV) chloride, zirconium(IV) ethoxide, zirconium(IV) fluoride, zirconium(IV) fluoride hydrate, zirconium(IV) hydroxide, zirconium(IV) iodide, zirconium(IV) sulfate hydrate, zirconium(IV) tert-butoxide, or combinations thereof.

7. The composition of claim 1, wherein the second compound comprises zinc citrate dihydrate, zinc acetate, zinc acetate dihydrate, zinc acetylacetonate hydrate, zinc acrylate, zinc chloride, zinc diethyldithiocarbamate, zinc dimethyldithiocarbamate, zinc fluoride, zinc fluoride hydrate, zinc hexafluoroacetylacetonate dihydrate, zinc methacrylate, zinc nitrate hexahydrate, zinc nitrate hydrate, zinc trifluoromethanesulfonate, zinc undecylenate, zinc trifluoroacetate hydrate, zinc tetrafluoroborate hydrate, zinc perchlorate hexahydrate, or combinations thereof.

8. The composition for an oxide thin film of claim 7, wherein the third compound comprises zirconium acetate, zirconium nitrate, zirconium(II) hydride, zirconium(IV) acetate hydroxide, zirconium(IV) acetylacetonate, zirconium (IV) butoxide solution, zirconium(IV) carbide, zirconium (IV) chloride, zirconium(IV) ethoxide, zirconium(IV) fluoride, zirconium(IV) fluoride hydrate, zirconium(IV) hydroxide, zirconium(IV) iodide, zirconium(IV) sulfate hydrate, zirconium(IV) tert-butoxide, or combinations thereof.

9. The composition of claim 1, wherein the first compound, the second compound and the third compound are dissolved in at least one of solvents selected from the group consisting of isopropanol, 2-methoxyethanol, dimethylformamide, ethanol, deionized water, methanol, acetylacetone, dimethylamineborane, and acetonitrile.

10. A composition for an oxide film, comprising:
a tin compound, a zinc compound, and a compound with an electronegativity lower than zinc, wherein a total of the tin compound, the zinc compound and the compound with an electronegativity lower than zinc is in a range of about 0.01 M to about 1 M,
wherein a molar ratio of the tin compound to the zinc compound is in a range of about 1:0.1 to about 0.1:1, and the number of moles of the compound with an electronegativity lower than zinc is half of the total number of moles of the tin compound and the zinc compound.

11. The composition of claim 10, wherein the tin compound comprises tin(II) chloride, tin(II) iodide, tin(II) chloride dihydrate, tin(II) bromide, tin(II) fluoride, tin(II) oxalate, tin(II) sulfide, tin(II) acetate, tin(IV) chloride, tin(IV) chloride pentahydrate, tin(IV) fluoride, tin(IV) iodide, tin(IV) sulfide, tin(IV) tert-butoxide, or combinations thereof.

12. The composition of claim 10, wherein the zinc compound comprises zinc citrate dihydrate, zinc acetate, zinc acetate dihydrate, zinc acetylacetonate hydrate, zinc acrylate, zinc chloride, zinc diethyldithiocarbamate, zinc dimethyldithiocarbamate, zinc fluoride, zinc fluoride hydrate, zinc hexafluoroacetylacetonate dihydrate, zinc methacrylate, zinc nitrate hexahydrate, zinc nitrate hydrate, zinc trifluoromethanesulfonate, zinc undecylenate, zinc trifluoroacetate hydrate, zinc tetrafluoroborate hydrate, zinc perchlorate hexahydrate, or combinations thereof.

13. The composition of claim 10, wherein the compound with an electronegativity lower than zinc is a zirconium compound selected from zirconium acetate, zirconium nitrate, zirconium(II) hydride, zirconium(IV) acetate hydroxide, zirconium(IV) acetylacetonate, zirconium(IV) butoxide solution, zirconium(IV) carbide, zirconium(IV) chloride, zirconium(IV) ethoxide, zirconium(IV) fluoride, zirconium(IV) fluoride hydrate, zirconium(IV) hydroxide, zirconium(IV) iodide, zirconium(IV) sulfate hydrate, zirconium(IV) tert-butoxide, or combinations thereof.

14. The composition of claim 10, wherein the compound with an electronegativity lower than zinc is an aluminum compound selected from aluminum acetate, aluminum acetylacetonate, aluminum borate, aluminum bromide, aluminum carbide, aluminum chloride, aluminum chloride hexahydrate, aluminum chloride hydrate, aluminum ethoxide, aluminum fluoride, aluminum hydroxide hydrate, aluminum iodide, aluminum isopropoxide, aluminum nitrate nonahydrate, aluminum nitride, aluminum phosphate, aluminum sulfate, aluminum sulfate hexadecahydrate, aluminum sulfate hydrate, aluminum tert-butoxide, or combinations thereof.

15. The composition of claim 10, wherein the compound with an electronegativity lower than zinc is a gallium compound selected from gallium nitride, gallium phosphide, gallium(II) chloride, gallium(III) acetylacetonate, gallium(III) bromide, gallium(III) chloride, gallium(III) fluoride, gallium (III) iodide, gallium(III) nitrate hydrate, gallium(III) sulfate, gallium(III) sulfate hydrate, or combinations thereof.

16. The composition of claim 10, wherein the compound with an electronegativity lower than zinc is a neodymium compound selected from neodymium(II) iodide, neodymium (III) acetate hydrate, neodymium(III) acetylacetonate hydrate, neodymium(III) bromide, neodymium(III) bromide hydrate, neodymium(III) carbonate hydrate, neodymium(III) chloride, neodymium(III) chloride hexahydrate, neodymium (III) fluoride, neodymium(III) hydroxide hydrate, neodymium(III) iodide, neodymium(III) isopropoxide, neodymium(III) nitrate hexahydrate, neodymium(III) nitrate hydrate, neodymium(III) oxalate hydrate, neodymium(III) phosphate hydrate, neodymium(III) sulfate, neodymium(III) sulfate hydrate, or combinations thereof.

17. The composition of claim 10, wherein the compound with an electronegativity lower than zinc is a tantalum compound selected from tantalum bromide, tantalum chloride, tantalum fluoride, or combinations thereof.

18. The composition of claim 10, wherein the compound with an electronegativity lower than zinc is a titanium compound selected from titanium bromide, titanium chloride, titanium fluoride, or combinations thereof.

19. The composition of claim 10, wherein the compound with an electronegativity lower than zinc is a barium compound selected from barium acetate, barium acetylacetonate, barium bromide, barium chloride, barium fluoride, barium hexafluoacetylacetonate, barium hydroxide, barium nitrate, or combinations thereof.

20. The composition of claim 10, wherein the compound with an electronegativity lower than zinc is a lanthanum compound selected from lanthanum acetate, lanthanum acetylacetonate, lanthanum bromide, lanthanum chloride, lanthanum hydroxide, lanthanum fluoride, lanthanum nitrate, or combinations thereof.

21. The composition of claim 10, wherein the compound with an electronegativity lower than zinc is a manganese compound selected from manganese acetate, manganese acetylacetonate, manganese bromide, manganese chloride, manganese fluoride, manganese nitrate, or combinations thereof.

22. The composition of claim 10, wherein the compound with an electronegativity lower than zinc is a chromium compound selected from chromium acetate, chromium acetylacetonate, chromium bromide, chromium chloride, chromium fluoride, chromium nitrate, or combinations thereof.

23. The composition of claim 10, wherein the compound with an electronegativity lower than zinc is a strontium compound selected from strontium acetate, strontium acetylacetonate, strontium bromide, strontium chloride, strontium fluoride, strontium hydroxide, strontium nitrate, or combinations thereof.

24. The composition of claim 10, wherein the compound with an electronegativity lower than zinc is a yttrium compound selected from yttrium acetate, yttrium acetylacetonate, yttrium chloride, yttrium fluoride, yttrium nitrate, or combinations thereof.

25. The composition of claim 10, wherein the compound with an electronegativity lower than zinc is a cerium compound selected from cerium(III) acetate hydrate, cerium(III) acetylacetonate hydrate, cerium(III) bromide, cerium(III) carbonate hydrate, cerium(III) chloride, cerium(III) chloride heptahydrate, cerium(III) fluoride, cerium(III) iodide, cerium (III) nitrate hexahydrate, cerium(III) oxalate hydrate, cerium (III) sulfate, cerium(III) sulfate hydrate, cerium(III) sulfate octahydrate, cerium(IV) fluoride, cerium(IV) hydroxide, cerium(IV) sulfate, cerium(IV) sulfate hydrate, cerium(IV) sulfate tetrahydrate, or combinations thereof.

26. The composition of claim 10, wherein a molar ratio of the tin compound:the zinc compound:the compound with an electronegativity lower than zinc is in a range of about 7:4:0.1 to about 7:4:1.

27. The composition of claim 26, wherein the molar ratio of the tin compound:the zinc compound:the compound with an electronegativity lower than zinc is in a range of about 7:4:0.3 to about 7:4:0.5.

28. An electronic device comprising an oxide semiconductor film, the oxide semiconductor film comprising tin, zinc, and a low electronegativity metal with an electronegativity lower than zinc wherein an atomic number ratio of the tin to the zinc is in a range of about 1:0.1 to about 0.1:1, and wherein the oxide semiconductor film comprises the low electronegativity metal within a half of a total sum of the atomic numbers of the tin and the zinc.

29. The electronic device of claim 28, wherein the atomic number ratio between the tin, the zinc and the metal is in a range of about 7:4:0.1 to about 7:4:1.

30. The electronic device of claim 28, wherein the low electronegativity metal comprises zirconium, aluminum, gallium, neodymium, chromium, cerium, yttrium, tantalum, titanium, barium, lanthanum, manganese, strontium, or combinations thereof.

31. The electronic device of claim 30, further comprising:
- a gate electrode spaced apart from and overlapping the oxide semiconductor film;
- a source electrode electrically connected to the oxide semiconductor film and disposed at one end of the gate electrode; and
- a drain electrode electrically connected to the oxide semiconductor film and disposed at the other end of the gate electrode.

* * * * *